(12) United States Patent
Zhao et al.

(10) Patent No.: US 11,854,802 B2
(45) Date of Patent: Dec. 26, 2023

(54) SUPER-FLEXIBLE TRANSPARENT SEMICONDUCTOR FILM AND PREPARATION METHOD THEREOF

(71) Applicant: Suzhou Institute of Nano-Tech and Nano-Bionics (Sinano), Chinese Academy of Sciences, Suzhou (CN)

(72) Inventors: Yukun Zhao, Suzhou (CN); Shulong Lu, Suzhou (CN); Zhiwei Xing, Suzhou (CN); Jianya Zhang, Suzhou (CN)

(73) Assignee: Suzhou Institute of Nano-Tech and Nano-Bionics (Sinano), Chinese Academy of Sciences, Jiangsu (CN)

( * ) Notice: Subject to any disclaimer, the term of this patent is extended or adjusted under 35 U.S.C. 154(b) by 323 days.

(21) Appl. No.: 17/299,954

(22) PCT Filed: Apr. 3, 2020

(86) PCT No.: PCT/CN2020/083148
§ 371 (c)(1),
(2) Date: Jun. 4, 2021

(87) PCT Pub. No.: WO2021/189523
PCT Pub. Date: Sep. 30, 2021

(65) Prior Publication Data
US 2022/0310384 A1  Sep. 29, 2022

(30) Foreign Application Priority Data

Mar. 24, 2020  (CN) .......................... 202010213156.3

(51) Int. Cl.
*H01L 29/78* (2006.01)
*H01L 21/02* (2006.01)
*H01L 29/66* (2006.01)

(52) U.S. Cl.
CPC .... *H01L 21/0259* (2013.01); *H01L 29/66522* (2013.01); *H01L 29/7842* (2013.01);
(Continued)

(58) Field of Classification Search
None
See application file for complete search history.

(56) References Cited

U.S. PATENT DOCUMENTS

| 2009/0068780 | A1 | 3/2009 | Chen et al. | |
|---|---|---|---|---|
| 2016/0035935 | A1* | 2/2016 | Han | H01L 33/06 438/47 |
| 2018/0226242 | A1* | 8/2018 | Kim | H01L 21/02458 |

FOREIGN PATENT DOCUMENTS

| CN | 201210447350 A | 2/2013 |
|---|---|---|
| CN | 105103310 A | 11/2015 |

(Continued)

OTHER PUBLICATIONS

Carbon, 2018, 130, 390, Shu-Ju Tsai, Epitaxy of Obliquely Aligned GaN Nanorods on Vertically Oriented Graphene Nanosheets for Transparent Flexible Piezoelectric Nanogenerators.
(Continued)

*Primary Examiner* — Suberr L Chi
*Assistant Examiner* — Carnell Hunter, III
(74) *Attorney, Agent, or Firm* — The Dobrusin Law Firm, PC

(57) ABSTRACT

The present invention discloses a super-flexible transparent semiconductor film and a preparation method thereof, the method includes: providing an epitaxial substrate; growing a sacrificial layer on the epitaxial substrate; stacking and growing at least one layer of $Al_{1-n}Ga_nN$ epitaxial layer on the sacrificial layer, wherein $0<n\leq1$; growing a nanopillar array containing GaN materials on the $Al_{1-n}Ga_nN$ epitaxial layer; etching the sacrificial layer so as to peel off an
(Continued)

epitaxial structure on the sacrificial layer as a whole; and transferring the epitaxial structure after peeling onto a surface of the flexible transparent substrate. Compared to traditional planar films, the present invention can not only improve the crystal quality by releasing stress, but also improve flexibility and transparency through characteristics of the nanopillar materials. In addition, a total thickness of the buffer layer and the sacrificial layer required by the epitaxial structure can be small, and there is no need for additional catalyst during an epitaxial growth process, which is beneficial for reducing epitaxial costs and process difficulty. The present invention is practical in use, and can provide technical support for invisible semiconductor devices and super-flexible devices.

18 Claims, 5 Drawing Sheets

(52) U.S. Cl.
CPC ...... *H01L 21/0251* (2013.01); *H01L 21/0254* (2013.01); *H01L 21/02381* (2013.01); *H01L 21/02458* (2013.01); *H01L 21/02502* (2013.01); *H01L 21/02603* (2013.01)

(56) References Cited

FOREIGN PATENT DOCUMENTS

| | | |
|---|---|---|
| CN | 106803478 A | 6/2017 |
| CN | 201710516403 A | 12/2017 |
| CN | 201610739608 A | 3/2018 |
| CN | 108010995 A | 5/2018 |
| CN | 201810077260 A | 7/2018 |
| CN | 109980054 A | 7/2019 |
| CN | 110061112 A | 7/2019 |
| CN | 201910530501 A | 10/2019 |

OTHER PUBLICATIONS

Nano Letters, 2015, 15, 6958, Flexible Light-Emitting Diodes Based on Vertical Nitride Nanowires, Xing Dai.
IOP Science, Freestanding GaN-Based Light-Emitting Diode Membranes on Y3Al5O12:Ce3+ Crystal Phosphor Plate for Efficient White Light Emission, Lungang Feng.

* cited by examiner

SUPER-FLEXIBLE TRANSPARENT SEMICONDUCTOR FILM AND PREPARATION METHOD THEREOF

TECHNICAL FIELD

The present invention relates to the technical field of semiconductor preparation, and in particular to a super-flexible transparent semiconductor film and a preparation method thereof.

BACKGROUND ART

In recent years, flexible optoelectronic devices have a broad application prospect with a huge market in wearable smart devices, light-emitting devices, solar cells, sensors, and biological applications, and the like. With the advantages of high temperature resistance, stable physicochemical properties, and strong radiation resistance, while a bandgap is wide and continuously tunable, Gallium nitride (GaN) based semiconductor materials are ideal materials for preparing optoelectronic devices at present. However, GaN materials are hard materials with poor flexibility, and substrates used to epitaxially grow GaN-based materials are generally non-transparent, and thus it is difficult to prepare super-flexible transparent GaN-based materials currently. With regard to widely studied two-dimensional materials at present, such as graphene, although have advantages of being super-flexible and transparent, these materials themselves cannot be used as semiconductor devices, and therefore cannot replace GaN-based materials to prepare semiconductor devices.

Currently, researchers first epitaxially grow a layer of 2 μm thick undoped GaN as a buffer layer on a sapphire substrate, then grow a layer of 2.5 μm thick GaN heavily doped layer as a sacrificial layer, and then grow a 0.8 μm thick planar structure epitaxial layer as desired for the device (Appl. Phys. Express 2016, 9, 081003). In this experiment, by etching the sacrificial layer and peeling off the planar structure layer on the sacrificial layer, a flexible film can be obtained. This preparation method provides a novel approach to prepare flexible GaN-based epitaxial films, and has innovativeness and value. However, there are several limitations: A. a 4.5 μm thick GaN epitaxial layer needs to be grown before the epitaxial structural layer required for the device is grown, which increases epitaxial costs; B. the 2.5 μm thick GaN heavily doped layer grown before the epitaxial structural layer required to grow the device is grown increases defect density and reduces epitaxial crystal quality; C. the 0.8 μm thick planar structure layer obtained after peeling is thick, transparency is unknown, and the article has no relevant data, even though wavelengths corresponding to band gaps of GaN and AlGaN materials are shorter than a visible light range (380 to 800 nm) and the GaN and AlGaN materials have higher transparency, while InGaN materials have a narrow band gap, capable of absorbing visible light, and have poor transparency; D. the epitaxial film obtained after peeling has a thickness of approximately 1 μm, which limits the flexibility, and the compression during a bending process is likely to damage the crystal quality.

After retrieval, a patent (Application No. CN201210447350.3) proposes using ion implantation to form a brittle bubble layer (as a sacrificial layer peeling substrate), or thinning the substrate to achieve flexibility by directly using laser lift-off, mechanical thinning, or etching thinning (Application No. CN201810077260.7, CN201910530501.3), none of which solves the four A to D problems as described above. A patent (Application No. CN 201710516403.5) also uses a pyramid epitaxial structure (horizontal dimension is above 10 μm) to improve the flexibility of the device, but the above A to C limitations remain difficult to solve. In addition, a patent (Application No. CN201610739608.5) proposes transferring graphene to a $SiO_2$/Si surface first, then photolithographically etching out array holes, grow a GaN-based nanopillar array (i.e., one-dimensional GaN-based materials), and finally simultaneously peeling off the graphene and the nanopillar so as to be transferred onto the flexible substrate. Theoretically, the solution can address the above four A to D problems to some extent, but there may be new limitations: E. in this solution, photolithographically prepared array holes are used as a basis for nanopillar growth, and sizes of the holes for preparing the nanopillar typically needs to be approximately 0.1 μm or even smaller, but the sizes of the array holes prepared by a typical photolithographic process is on the order of a few microns, and if this size is reduced, costs and process difficulty of photolithography may be sharply increased; F. epitaxial growth of one-dimensional GaN-based materials directly on graphene is still immature currently, which is difficult to ensure the epitaxial crystal quality thereof, and the graphene can be damaged to some extent during photolithography and epitaxial growth; G. the graphene itself is an extremely thin film, the thickness of single-layer graphene is about 0.1 nm, and the graphene itself is extremely susceptible to damage, in other words, the step of simultaneously peeling off the graphene and the nanopillar so as to be transferred onto the flexible substrate is quite difficult in actual operation, and is easy to damage the integrity of the graphene or nanopillar array. In addition, an article has been reported to use a tape (see Carbon 2018, 130, 390) or a siloxane (PDMS) material (see Nano Lett. 2015, 15, 6958) to directly peel off the nanopillar array by a mechanical force. This mechanical peeling method has advantages of low cost and low difficulty, and can solve the above A to G problems to some extent, but the direct peeling method by the mechanical force can damage the crystal quality of the nanopillar array and the uniformity of the bottom of the nanopillar array, while the tape or PDMS material used to connect the nanopillars reduces the transparency of the film after peeling to a certain extent.

In terms of current techniques, it is very difficult to prepare GaN-based semiconductor materials having both super-flexible and transparent properties while also requiring low production cost and low process difficulty.

SUMMARY OF THE INVENTION

In view of the deficiencies in the prior art, the present invention provides a super-flexible transparent (invisible) semiconductor film and a preparation method thereof, which can improve crystal quality, simply peel off the semiconductor film with low cost, and can provide technical support for future invisible semiconductor devices and super-flexible devices.

For the above purposes, the present invention adopts a technical solution as follows.

A preparation method of a super-flexible transparent semiconductor film, including:
  providing an epitaxial substrate;
  growing a sacrificial layer on the epitaxial substrate;
  stacking and growing at least one layer of $Al_{1-n}Ga_nN$ epitaxial layer on the sacrificial layer, in which $0<n\leq 1$;

growing a nanopillar array containing GaN materials on the $Al_{1-n}Ga_nN$ epitaxial layer;

etching the sacrificial layer so as to peel off an epitaxial structure on the sacrificial layer as a whole; and transferring the epitaxial structure after peeling onto a surface of the flexible transparent substrate.

As one of the embodiments, a plurality of $Al_{1-n}Ga_nN$ epitaxial layers are stacked and grown on the sacrificial layer, n values corresponding to adjacent two layers of $Al_{1-n}Ga_nN$ epitaxial layers are different, and the nanopillar array is formed on the outermost $Al_{1-n}Ga_nN$ epitaxial layer.

As one of the embodiments, etching the sacrificial layer includes the step of:

preparing electrodes conducting the sacrificial layer on the $Al_{1-n}Ga_nN$ epitaxial layer, and then etching the sacrificial layer in an electrochemical manner.

As one of the embodiments, a pattern is etched on the $Al_{1-n}Ga_nN$ epitaxial layer in a photolithographic manner prior to etching the sacrificial layer in an electrochemical manner, and separating the nanopillars of the nanopillar array in patterns of different regions.

As one of the embodiments, the n values corresponding to the plurality of $Al_{1-n}Ga_nN$ epitaxial layers on the sacrificial layer gradually decreases or gradually increases in an epitaxial growth direction.

As one of the embodiments, a buffer layer is also grown on the epitaxial substrate before the step of growing the sacrificial layer on the epitaxial substrate; the sacrificial layer and/or the buffer layer uses one or more layers of $Al_{1-b}Ga_bN$ materials, in which $0 \leq b < 1$, and b values corresponding to the adjacent two layers of $Al_{1-n}Ga_nN$ materials are different.

As one of the embodiments, the b values corresponding to each layer of $Al_{1-b}Ga_bN$ materials on the epitaxial substrate gradually increases in the epitaxial growth direction.

As one of the embodiments, the nanopillar array includes a first $Al_{1-m}Ga_mN$ nanopillar, a second $Al_{1-x}Ga_xN$ nanopillar or an $In_{1-x}Ga_xN$ nanopillar, and a third $Al_{1-z}Ga_zN$ nanopillar that are stacked and grown sequentially on the $Al_{1-n}Ga_nN$ epitaxial layer from bottom to top, in which $0 < m \leq 1$, $0 \leq x \leq 1$, and $0 < z \leq 1$.

As one of the embodiments, a height of the first $Al_{1-m}Ga_mN$ nanopillar is 100 nm to 1500 nm, a height of the second $Al_{1-x}Ga_xN$ nanopillar or the $In_{1-x}Ga_xN$ nanopillar is 20 nm to 500 nm, a height of the third $Al_{1-z}Ga_zN$ nanopillar is 20 nm to 600 nm; and/or a diameter of a single nanopillar in the nanopillar array is no more than 400 nm.

As one of the embodiments, the first $Al_{1-m}Ga_mN$ nanopillar includes a plurality of layers, m values corresponding to adjacent two layers of the first $Al_{1-m}Ga_mN$ nanopillar are different; and/or, the second $Al_{1-x}Ga_xN$ nanopillar or the $In_{1-x}Ga_xN$ nanopillar includes a plurality of layers, and x values corresponding to the adjacent two layers of the second $Al_{1-x}Ga_xN$ nanopillar or the adjacent two layers of the $In_{1-x}Ga_xN$ nanopillar are different; and/or, the third $Al_{1-z}Ga_zN$ nanopillar includes a plurality of layers, and z values corresponding to the adjacent two layers of the third $Al_{1-z}Ga_zN$ nanopillar are different.

As one of the embodiments, the m values gradually decrease in a growth direction of the first $Al_{1-m}Ga_mN$ nanopillar.

Another objective of the present invention is to provide a super-flexible transparent (invisible) semiconductor film according to any of the above preparation methods of the super-flexible transparent semiconductor film. The super-flexible transparent semiconductor film includes: a flexible transparent substrate; and an epitaxial structure provided on a surface of the flexible transparent substrate, in which the epitaxial structure includes at least one layer of $Al_{1-n}Ga_nN$ epitaxial layer provided on the surface of the flexible transparent substrate, and a nanopillar array containing GaN materials and provided on the $Al_{1-n}Ga_nN$ epitaxial layer, in which $0 < n \leq 1$.

As one of the embodiments, a total thickness $H_1$ of all $Al_{1-n}Ga_nN$ epitaxial layers provided on the surface of the flexible transparent substrate satisfies: 1 nm $\leq H_1 <$ 800 nm.

According to the present invention, stress due to crystal lattice and thermal mismatch can be released through a one-dimensional nanopillar structure, thereby improving the crystal quality, while, relative to planar films, the nanopillar array has higher transmittance in the visible light range, which improves the transparency of prepared samples as required. In addition, a total thickness of the buffer layer and the sacrificial layer required by the epitaxial structure for preparing the super-flexible transparent semiconductor film according to the present invention can be small (<200 nm), and the nanopillar array is directly grown without additional catalyst during an epitaxy process, which is beneficial for reducing epitaxial costs and process difficulty.

REFERENCE NUMERALS ARE AS FOLLOWS

Figure 1:
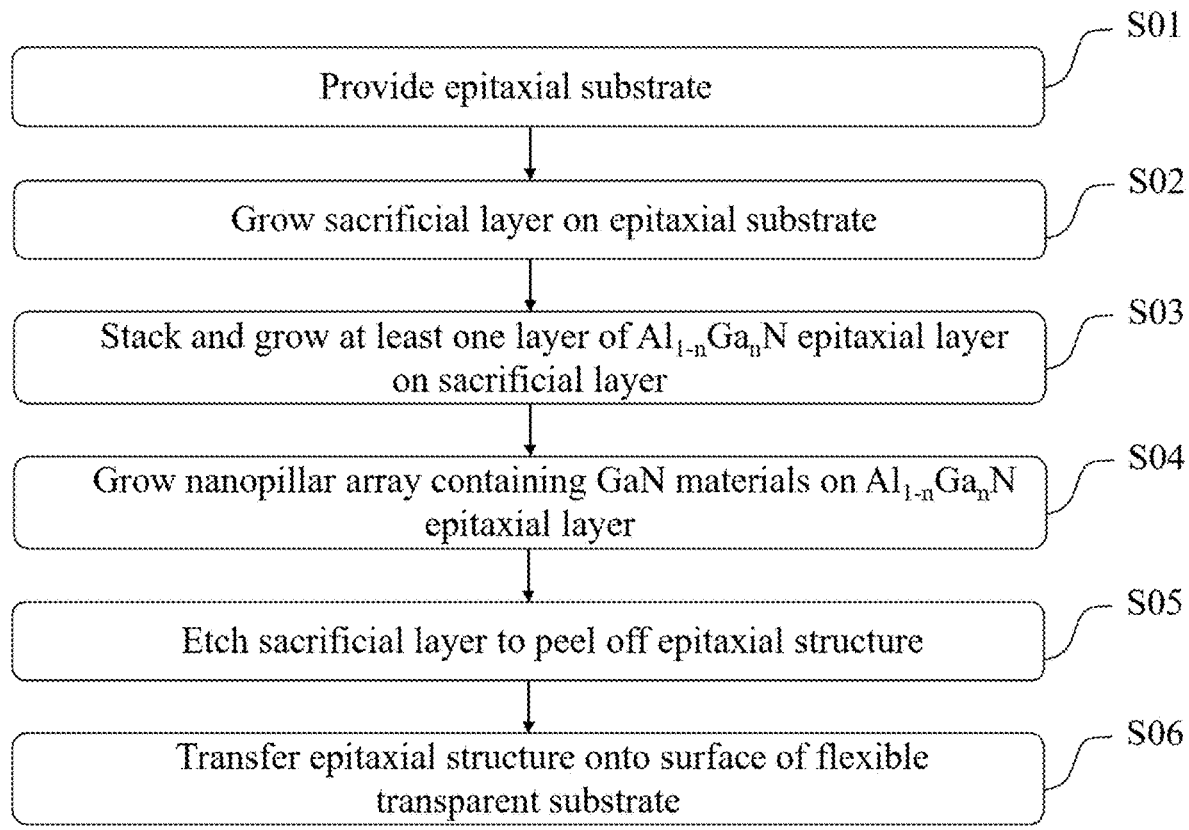
FIG. 1 is a schematic flowchart of preparing an epitaxial structure of a super-flexible transparent semiconductor film according to the present invention.

1—epitaxial substrate;
100—flexible transparent substrate;
2—sacrificial layer;
11—$Al_{1-n}Ga_nN$ epitaxial layer;
111—lower $Al_{1-n}Ga_nN$ epitaxial layer;
112—upper $Al_{1-n}Ga_nN$ epitaxial layer;
12—nanopillar array;
121—first $Al_{1-m}Ga_mN$ nanopillar;

122—second $Al_{1-x}Ga_xN$ nanopillar or $In_{1-x}Ga_xN$ nanopillar;
123—third $Al_{1-z}Ga_zN$ nanopillar; and
C—groove.

DETAILED DESCRIPTION

To provide a clearer understanding of the purpose, technical solutions and advantages of the present invention, the present invention will be further described in detail with reference to the accompanying drawings and embodiments. It should be understood that the specific embodiments described herein are for illustration of the present invention only and are not intended to limit the present invention.

In the drawings, shapes and sizes of elements may be enlarged for clarity, and the same reference numerals will be used throughout to represent the same or similar elements.

It should be understood that, although terms "first", "second", etc. can be used herein to describe various structures, these structures should not be limited by these terms, which are merely used to distinguish one structure from another. Terms "upper" and "lower" are merely for convenience of describing relative positional relationships of various objects in the embodiments of the present invention, and are distinguished only by an orientation shown in corresponding drawings and do not refer to an absolute direction.

Figure 2:
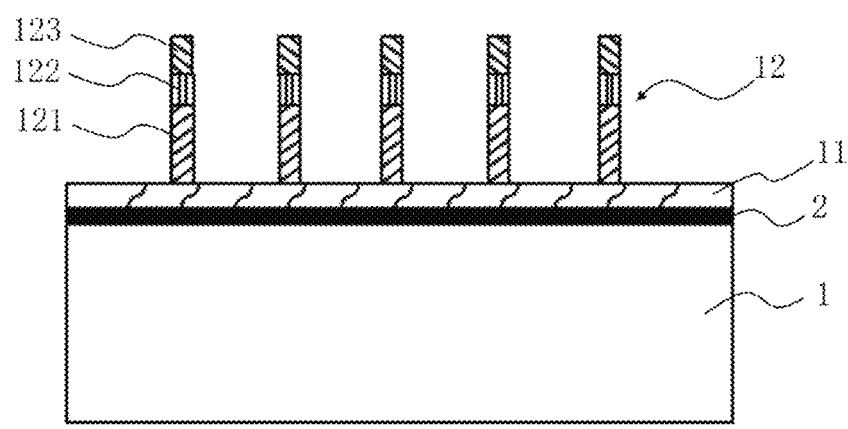
FIG. 2 is a schematic structural view illustrating an epitaxial structure of a super-flexible transparent semiconductor film according to a first embodiment of the present invention.

Referring to FIGS. 1 and 2, the present invention provides a preparation method of a super-flexible transparent semiconductor film, including:

S01, providing an epitaxial substrate 1.

Here, the epitaxial substrate 1 can be selected from a silicon wafer (Si), a sapphire substrate, a GaN self-supporting substrate, silicon carbide (SiC), a diamond substrate, a metal substrate, and a substrate covered with a two-dimensional material.

S02, growing a sacrificial layer 2 on the epitaxial substrate 1.

A buffer layer and the sacrificial layer 2 can be sequentially stacked and grown on the epitaxial substrate 1, or only the sacrificial layer 2 can be grown on the epitaxial substrate 1. That is, the buffer layer can also be grown on the epitaxial substrate 1 before the step of growing the sacrificial layer 2 on the epitaxial substrate 1. The sacrificial layer 2, the buffer layer can use single-layer or multi-layer $Al_{1-b}Ga_bN$ materials respectively, in which $0 \le b < 1$. Preferably, b values corresponding to adjacent two layers of $Al_{1-b}Ga_bN$ materials on the epitaxial substrate 1 are different, that is, the b values corresponding to the interior adjacent two layers of $Al_{1-b}Ga_bN$ materials are different when the sacrificial layer 2 or the buffer layer is multi-layer $Al_{1-b}Ga_bN$ materials. Whether the sacrificial layer 2 and the buffer layer use single-layer or multi-layer $Al_{1-b}Ga_bN$ materials, the b values corresponding to the two layers of $Al_{1-b}Ga_bN$ materials in which the sacrificial layer 2 is in contact with the buffer layer are also different.

A total thickness of the buffer layer and the sacrificial layer 2 is $H_0$, $1\ nm \le H_0 < 200\ nm$, the thickness of the sacrificial layer 2 is $H_0$ when only the sacrificial layer 2 is grown on the epitaxial substrate 1 without the buffer layer; and the sum of the thicknesses of the buffer layer and the sacrificial layer 2 is $H_0$ when the buffer layer and the sacrificial layer 2 are sequentially stacked and grown on the epitaxial substrate 1. Further, the b values corresponding to each layer of $Al_{1-b}Ga_bN$ materials on the epitaxial substrate 1 gradually increases in an epitaxial growth direction.

S03, stacking and growing single-layer or multi-layer $Al_{1-n}Ga_nN$ epitaxial layer 11 on the sacrificial layer 2, in which $0 < n \le 1$.

When a plurality of $Al_{1-n}Ga_nN$ epitaxial layers 11 are stacked and grown on the sacrificial layer 2, n values corresponding to adjacent two layers of $Al_{1-n}Ga_nN$ epitaxial layers 11 are different, and a nanopillar array 12 is formed on the outermost $Al_{1-n}Ga_nN$ epitaxial layer 11. A total thickness $H_1$ of all $Al_{1-n}Ga_nN$ epitaxial layers 11 provided on a surface of a flexible transparent substrate 100 satisfies: $1\ nm \le H_1 < 800\ nm$.

S04, growing the nanopillar array 12 containing GaN materials on the $Al_{1-n}Ga_nN$ epitaxial layer 11.

The $Al_{1-n}Ga_nN$ epitaxial layer 11 can serve as a connection layer between the nanopillars after peeling, and also facilitates further buffering and nucleation of the nanopillars. The film mainly includes a nanopillar array, which facilitates release of epitaxial stress and improves crystal quality as compared to traditional film structures; and the buffer layer and the sacrificial layer 2 that are grown at the bottom facilitate further relieving the stress due to crystal lattice and thermal mismatch and facilitate formation of a nanopillar nucleation layer.

When a plurality of $Al_{1-n}Ga_nN$ epitaxial layers 11 are provided, the n values corresponding to the plurality of $Al_{1-n}Ga_nN$ epitaxial layers on the sacrificial layer 2 gradually decreases or gradually increases in the epitaxial growth direction in a gradient trend, which facilitates preparing a curly film.

In particular, the nanopillar array 12 includes a first $Al_{1-m}Ga_mN$ nanopillar 121, a second $Al_{1-x}Ga_xN$ nanopillar or an $In_{1-x}Ga_xN$ nanopillar 122, and a third $Al_{1-z}Ga_zN$ nanopillar 123 that are stacked and grown sequentially on the $Al_{1-n}Ga_nN$ epitaxial layer 11 from bottom to top, in which $0 < m \le 1$, $0 \le x \le 1$, and $0 < z \le 1$.

The first $Al_{1-m}Ga_mN$ nanopillar 121 can have a single-layer structure or can include a multi-layer structure. When the first $Al_{1-m}Ga_mN$ nanopillar 121 includes a multi-layer structure, m values corresponding to adjacent two layers of the first $Al_{1-m}Ga_mN$ nanopillar 121 are different. Preferably, the m values gradually decrease in a growth direction of the first $Al_{1-m}Ga_mN$ nanopillar 121 in a gradient trend.

Similarly, the second $Al_{1-x}Ga_xN$ nanopillar or the $In_{1-x}Ga_xN$ nanopillar 122 can have a single-layer structure or can include a multi-layer structure. When the second $Al_{1-x}Ga_xN$ nanopillar or the $In_{1-x}Ga_xN$ nanopillar 122 includes a multi-layer structure, x values corresponding to the adjacent two layers of the second $Al_{1-x}Ga_xN$ nanopillar or the adjacent two layers of the $In_{1-x}Ga_xN$ nanopillar are different.

The third $Al_{1-z}Ga_zN$ nanopillar 123 can have a single-layer structure or can include a multi-layer structure. When the third $Al_{1-z}Ga_zN$ nanopillar 123 includes a multi-layer structure, z values corresponding to the adjacent two layers of the third $Al_{1-z}Ga_zN$ nanopillar 123 are different.

Furthermore, content of Al component within each of the first $Al_{1-m}Ga_mN$ nanopillar 121, the second $Al_{1-x}Ga_xN$ nanopillar 122, and the third $Al_{1-z}Ga_zN$ nanopillar 123 is uniformly distributed or distributed in a gradually changing manner (e.g., gradually increases or gradually decreases in the growth direction) respectively.

For example, a height of the first $Al_{1-m}Ga_mN$ nanopillar 121 can be 100 nm to 1500 nm, a height of the second $Al_{1-x}Ga_xN$ nanopillar or the $In_{1-x}Ga_xN$ nanopillar 122 can be 20 nm to 500 nm, a height of the third $Al_{1-z}Ga_zN$ nanopillar 123 can be 20 nm to 600 nm, and a diameter of a single nanopillar in the nanopillar array 12 is no more than 400 nm.

S05, etching the sacrificial layer 2 so as to peel off an epitaxial structure on the sacrificial layer 2 as a whole.

As one of the embodiments, the step of etching the sacrificial layer 2 can include: preparing electrodes conducting the sacrificial layer 2 on the $Al_{1-n}Ga_nN$ epitaxial layer 11, and then etching the sacrificial layer 2 in an electrochemical manner.

A pattern is etched on the $Al_{1-n}Ga_nN$ epitaxial layer 11 in a photolithographic manner prior to etching the sacrificial layer 2 in an electrochemical manner, and the nanopillars of the nanopillar array 12 are separated in patterns of different regions, so that the shape and curvature of the semiconductor film after peeling are conveniently regulated. A voltage U used in the etching in a photolithographic manner satisfies: $0.1\ V \leq U \leq 500\ V$. The photolithography process cannot damage a large area of the nanopillar array 12, a shape of an etching pattern can be triangular, rectangular, polygonal, circular, and a radial dimension is between 1 μm and 10000 μm. That is, multiple nanopillars of the nanopillar array 12 can be separated into several interspaced sub-regions by etching the etching pattern configured to be a closed shape on the $Al_{1-n}Ga_nN$ epitaxial layer 11, which helps to regulate internal stress of the $Al_{1-n}Ga_nN$ epitaxial layer 11, thereby regulating the shape and curvature of the film after peeling.

All the buffer layer, the sacrificial layer 2, the $Al_{1-n}Ga_nN$ epitaxial layer 11, and the nanopillar array 12 as described above can be formed using molecular beam epitaxy or vapor deposition.

S06, transferring the epitaxial structure after peeling onto a surface of the flexible transparent substrate 100.

The flexible transparent substrate 100 may include conductive film, epoxy, glass, transparent tape, and two-dimensional film materials.

Corresponding to the above preparation method, the present invention further provides a super-flexible transparent semiconductor film, including: a flexible transparent substrate 100; and an epitaxial structure provided on a surface of the flexible transparent substrate 100, in which the epitaxial structure includes at least one layer of $Al_{1-n}Ga_nN$ epitaxial layer 11 provided on the surface of the flexible transparent substrate 100, and a nanopillar array 12 containing GaN materials and provided on the $Al_{1-n}Ga_nN$ epitaxial layer 11, in which $0<n\leq 1$.

The above preparation methods and corresponding structures of the present invention will be described by specific embodiments, but the following embodiments are only specific examples of the present invention and the invention is not limited to all these embodiments.

First Embodiment

As shown in FIG. 2, the present embodiment provides a preparation method of a super-flexible transparent semiconductor film.

First, taking a sheet of n-type Si substrate as the epitaxial substrate 1, and cleaning a surface of the Si substrate with HF acid, acetone, and ethanol solution respectively for 5 minutes.

Then, placing the Si substrate in a Molecular Beam Epitaxy (MBE) growth chamber for epitaxial growth and forming an epitaxial structure, specifically including the following steps:

Step 1, growing an AlN sacrificial layer 2 having a thickness of about 3 nm on the Si substrate, i.e., the sacrificial layer 2 is $Al_{1-b}Ga_bN$ materials and can also function as a buffer layer, in which b=0.

Step 2, growing a GaN epitaxial layer having a height of about 10 nm on the AlN sacrificial layer 2, i.e., the $Al_{1-n}Ga_nN$ epitaxial layer 11, in which n=1.

Step 3, growing a layer of GaN nanopillars having a height of about 400 nm on the GaN epitaxial layer as the first $Al_{1-m}Ga_mN$ nanopillar 121, in which m=1.

Figure 3:
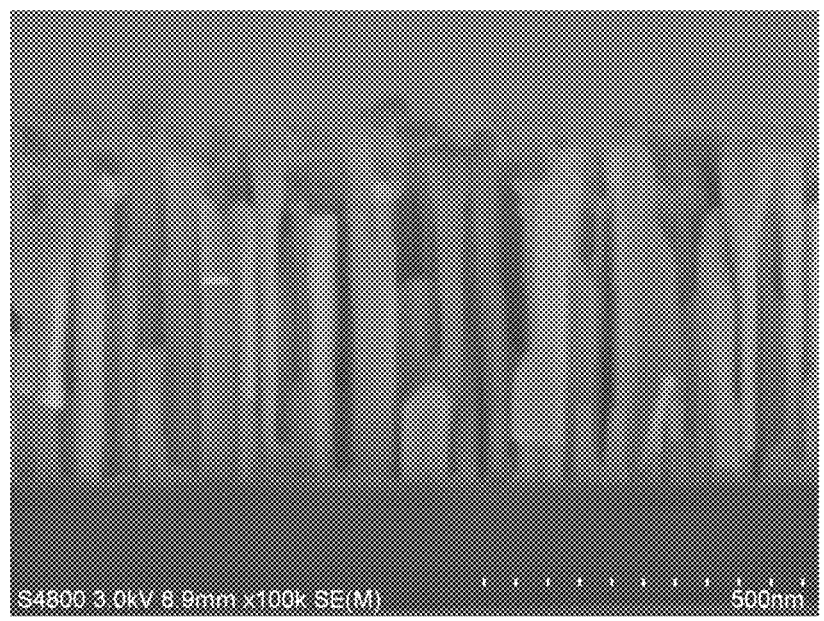
FIG. 3 is a side view of a scanning electron microscope (SEM) of the semiconductor film according to the first embodiment of the present invention.

Step 4, growing a layer of $In_{0.3}Ga_{0.7}N$ nanopillars having a thickness of 30 nm on the GaN nanopillar as the $In_{1-x}Ga_xN$ nanopillar 122, in which x=0.7; then growing a layer of GaN nanopillars having a thickness of 10 nm as the third $Al_{1-z}Ga_zN$ nanopillar 123, in which z=1, thereby obtaining a nanopillar array similar to that shown in FIG. 3.

Figure 4:
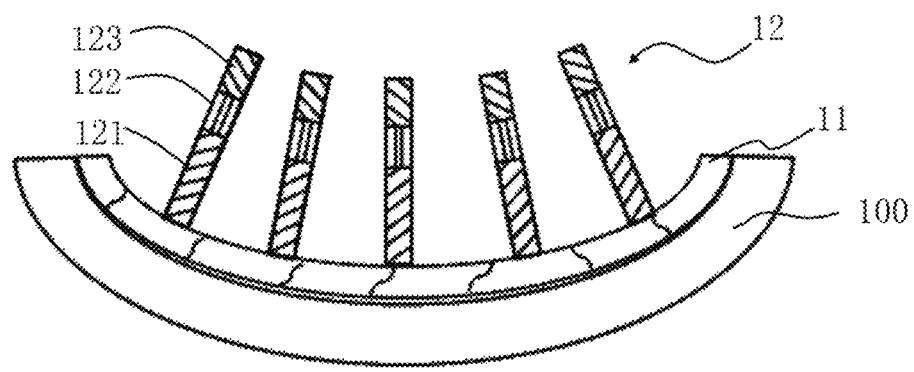
FIG. 4 is a schematic view of the epitaxial structure of the super-flexible transparent semiconductor film after peeling and transfer according to the first embodiment of the present invention.

Step 5, introducing electrodes to a rear side (bottom surface) of the Si substrate, performing an electrochemical etching in the NaOH solution using a voltage of about 5 V to etch the AlN sacrificial layer 2, etching the Si substrate to obtain an epitaxial film on the sacrificial layer 2, and transferring the epitaxial film to a surface of a transparent tape, in which the transparent tape can be taken as the flexible transparent substrate 100 as shown in FIG. 4.

Figure 5:
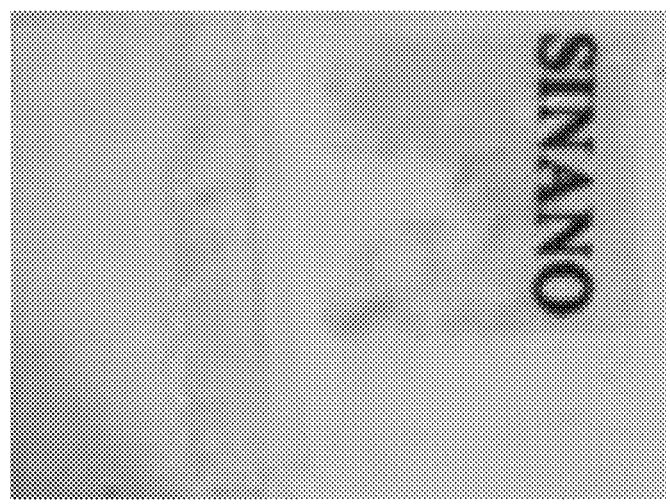
FIG. 5 is a pictorial diagram of the super-flexible transparent semiconductor film according to the first embodiment of the present invention.
Figure 6:
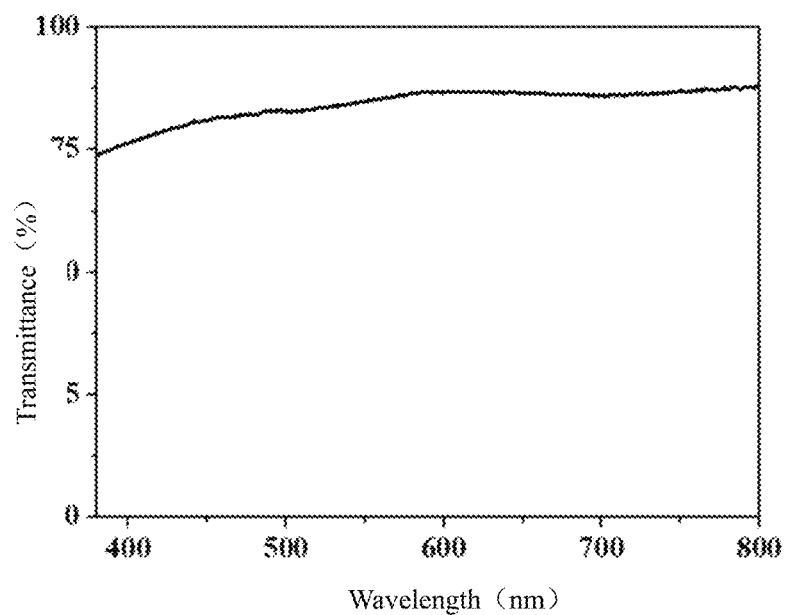
FIG. 6 is a test diagram of transmission spectrum of the super-flexible transparent semiconductor film according to the first embodiment of the present invention.
Figure 7:
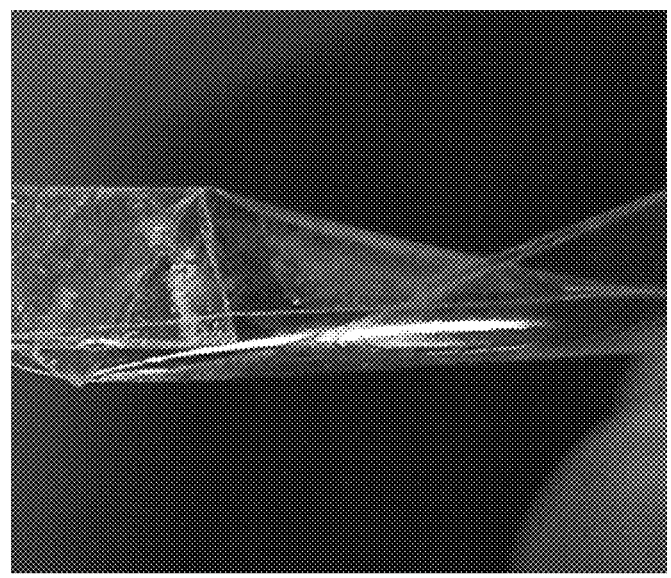
FIG. 7 is a pictorial diagram of the super-flexible transparent semiconductor film in a bending state according to the first embodiment of the present invention.

As shown in FIG. 5, a sample of a super-flexible transparent semiconductor film can be obtained by the preparation process described above. A "SINANO" mark was written on a piece of paper, and was still visible through the sample, which fully shows that the sample had a higher transparency. As shown in FIG. 6, the sample was found to have a transmittance greater than 70% in a visible wave band (380 nm to 800 nm) after a transmittance test. As shown in FIG. 7, the film sample has excellent flexibility.

Second Embodiment

The present embodiment provides another preparation method of a super-flexible transparent semiconductor film.

First, taking a sheet of n-type Si substrate as the epitaxial substrate 1, and cleaning a surface of the Si substrate with HF acid, acetone, and ethanol solution respectively for 6 minutes.

Then, placing the Si substrate in an MBE growth chamber for epitaxial growth and forming an epitaxial structure, specifically including the following steps:

Step 1, growing an AlN sacrificial layer having a thickness of about 5 nm on the Si substrate, i.e., the sacrificial layer is $Al_{1-b}Ga_bN$ materials and can also function as a buffer layer, in which b=0.

Step 2, growing a layer of n-type Si-doped GaN epitaxial layer having a height of about 100 nm on the AlN sacrificial layer, i.e., the $Al_{1-n}Ga_nN$ epitaxial layer 11, in which n=1.

Step 3, growing a layer of n-type Si-doped GaN nanopillars having a height of about 800 nm on the GaN epitaxial layer as the first $Al_{1-m}Ga_mN$ nanopillar 121, in which m=1.

Step 4, growing a layer of $Al_{0.3}Ga_{0.7}N$ nanopillars having a thickness of 100 nm on the GaN nanopillar as the second $Al_{1-x}Ga_xN$ nanopillar 122, in which x=0.7; then growing a layer of p-type Mg-doped GaN nanopillars having a thickness of 80 nm as the third $Al_{1-z}Ga_zN$ nanopillar 123, in which z=1.

Step 5, introducing electrodes to a rear side (bottom surface) of the Si substrate, performing an electrochemical etching in an $HNO_3$ solution using a voltage of about 10 V to etch the AlN sacrificial layer 2, and transferring the epitaxial film on the sacrificial layer to a surface of an ITO conductive film.

Third Embodiment

The present embodiment is basically identical to the first embodiment, except that the second $Al_{1-x}Ga_xN$ nanopillar 122 in the present embodiment includes a plurality of superlattice-like structures arranged in a stacked manner, $Al_{1-x}Ga_xN$ material layers with different x values are stacked in each of the superlattice-like structures, and the $Al_{1-x}Ga_xN$ material layers with different x values are periodically and alternately stacked to form the second $Al_{1-x}Ga_xN$ nanopillar 122.

Specifically, the second $Al_{1-x}Ga_xN$ nanopillar 122 has 5 $Al_{0.1}Ga_{0.9}N$ (10 nm)/GaN (3 nm) superlattice-like structures, i.e., $Al_{0.1}Ga_{0.9}N$ (10 nm) alternates with GaN (3 nm) with 5 cycles, in which x values of adjacent two layers of $Al_{1-x}Ga_xN$ materials are 0.9 and 1 respectively.

Fourth Embodiment

The present embodiment is basically identical to the second embodiment, except that the epitaxial substrate 1 in the present embodiment is a sapphire substrate having a TiN metal film with a thickness of 500 nm.

Fifth Embodiment

The present embodiment is basically identical to the first embodiment, except that an epitaxial device in the present embodiment is a metal-organic chemical vapor deposition (MOCVD) device.

Sixth Embodiment

The present embodiment provides another preparation method of a super-flexible transparent semiconductor film.

First, taking a sheet of n-type Si substrate as the epitaxial substrate 1, and cleaning a surface of the Si substrate with HF acid, acetone, and ethanol solution respectively for 3 minutes.

Then, placing the Si substrate in an MBE growth chamber for epitaxial growth and forming an epitaxial structure, specifically including the following steps:

Step 1, growing an AlN sacrificial layer having a thickness of about 4 nm on the Si substrate, i.e., $Al_{1-b}Ga_bN$ materials, in which b=0.

Step 2, growing a layer of n-type Si-doped GaN epitaxial layer having a height of about 100 nm on the AlN sacrificial layer, i.e., a lower $Al_{1-n}Ga_nN$ epitaxial layer 111, in which n=1; then growing a layer of n-type Si-doped $Al_{0.4}Ga_{0.6}N$ epitaxial layer having a height of about 80 nm, i.e., an upper $Al_{1-n}Ga_nN$ epitaxial layer 112, in which n=0.6, which is used to regulate stress of film after peeling so as to form a curly film.

Step 3, growing a layer of n-type Si-doped GaN nanopillars having a height of about 400 nm on the GaN epitaxial layer as the first $Al_{1-m}Ga_mN$ nanopillar 121, in which m=1.

Step 4, growing a layer of $In_{0.1}Ga_{0.9}N$ (4 nm)/GaN (15 nm) with a plurality of cycles (e.g., 10 cycles) on the GaN nanopillar as the second $Al_{1-x}Ga_xN$ nanopillar 122, in which x is 0.9 and 1 respectively; and growing a p-type Mg-doped GaN nanopillar having a thickness of 120 nm as the third $Al_{1-z}Ga_zN$ nanopillar 123, in which z=1.

Figure 8:
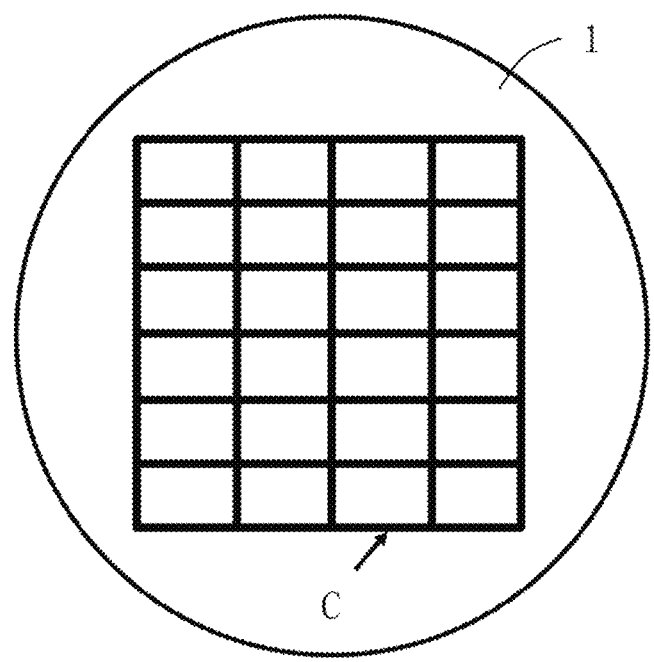
FIG. 8 is a schematic diagram of a photolithographic structure of a semiconductor film surface according to a sixth embodiment of the present invention.

As shown in FIG. 8, a grid in the form of a rectangular array can be etched on an epitaxial sample in a photolithographic manner, in which a single rectangle has a length of 30 μm and a width of 20 μm, each rectangle is separated by etched grooves C, i.e., an etching pattern is formed, and the grooves C are engraved onto the epitaxial substrate 1 to separate the epitaxial structure into several portions that are independent of each other.

Figure 9:
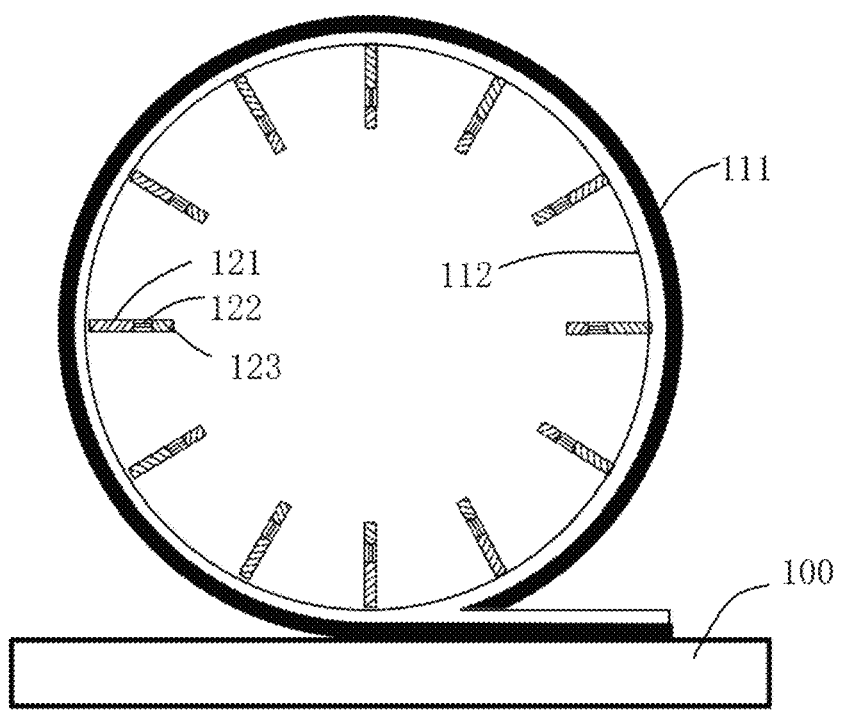
FIG. 9 is a schematic structural view of a semiconductor film after peeling and curling according to the sixth embodiment of the present invention.

Step 5, introducing electrodes to a rear side of the Si substrate, performing an electrochemical etching in an $HNO_3$ solution using a voltage of about 15 V to etch the AlN sacrificial layer 2, and transferring the epitaxial film on the sacrificial layer to a surface of an ITO conductive film, in which the film forms a micron roll structure having nanopillars due to stress as shown in FIG. 9.

Seventh Embodiment

The present embodiment is basically identical to the sixth embodiment, except that a grid in the form of a circular array is etched on the epitaxial sample in a photolithographic manner, in which a single circle has a diameter of 50 μm, an electrochemical etching is performed in a KOH solution using a voltage of about 20V, and the epitaxial film on the sacrificial layer is transferred to two-dimensional material graphene.

In view of the above, the present invention has at least the following beneficial effects as compared to the prior art.

(1) Low cost: A total thickness of the buffer layer and the sacrificial layer required by preparing the epitaxial structure of the super-flexible transparent semiconductor film according to the present invention is small (<200 nm), and the nanopillar array is directly grown without additional catalyst during an epitaxy process, which is beneficial for reducing epitaxial costs; in addition, both electrochemical etching and photolithography necessary for a preparation solution are common etching processes, and the costs are low.

(2) High crystal quality: The super-flexible transparent semiconductor film prepared by the present invention mainly includes a nanopillar array, which facilitates release of epitaxial stress and improves crystal quality as compared to traditional film structures; and the buffer layer and the sacrificial layer that are grown at the bottom facilitate further relieving the stress due to crystal lattice and thermal mismatch and facilitate formation of a nanopillar nucleation layer.

(3) Simple and controllable in process and practical in use; The super-flexible transparent film is directly grown without additional catalyst during an epitaxy process, which reduces process difficulty; both electrochemical etching and photolithography necessary for the preparation process are common etching processes, and requirements for accuracy are not high, so that practicability is facilitated.

(4) Good flexibility and high transparency: A connecting portion of the nanopillar array prepared by the present invention is a $Al_{1-n}Ga_nN$ epitaxial layer having a low absorbance of visible light and a high transparency; the connecting portion $Al_{1-n}Ga_nN$ epitaxial layer has a small thickness, there is a large gap between the nanopillar arrays, which improves the flexibility of the film while avoiding compression and damage between the epitaxial structures during the epitaxy process; the nanopillar array has higher transmittance in a visible light range, thereby improving the transparency of prepared samples as required.

The above are only descriptions of embodiments of the present application. It should be noted that for those skilled in the art, a variety of modifications and polishing are possible without departing from the principles of the present application and should also fall within the scope of the present application.

The invention claimed is:

1. A preparation method of a super-flexible transparent semiconductor film, comprising:
providing an epitaxial substrate;
growing a sacrificial layer on the epitaxial substrate;

stacking and growing at least one layer of $Al_{1-n}Ga_nN$ epitaxial layer on the sacrificial layer, wherein $0<n\le1$;

growing a nanopillar array containing GaN materials on the $Al_{1-n}Ga_nN$ epitaxial layer;

etching the sacrificial layer so as to peel off an epitaxial structure on the sacrificial layer as a whole; and transferring the epitaxial structure after peeling onto a surface of a flexible transparent substrate.

2. The preparation method of a super-flexible transparent semiconductor film according to claim 1, wherein a plurality of $Al_{1-n}Ga_nN$ epitaxial layers are stacked and grown on the sacrificial layer, n values corresponding to adjacent two layers of $Al_{1-n}Ga_nN$ epitaxial layers are different, and the nanopillar array is formed on an outermost $Al_{1-n}Ga_nN$ epitaxial layer.

3. The preparation method of a super-flexible transparent semiconductor film according to claim 2, wherein the n values corresponding to the plurality of $Al_{1-n}Ga_nN$ epitaxial layers on the sacrificial layer gradually decreases or gradually increases in an epitaxial growth direction.

4. The preparation method of a super-flexible transparent semiconductor film according to claim 1, wherein etching the sacrificial layer includes the steps of:

preparing electrodes conducting the sacrificial layer on the $Al_{1-n}Ga_nN$ epitaxial layer, and then etching the sacrificial layer in an electrochemical manner; and etching a pattern on the $Al_{1-n}Ga_nN$ epitaxial layer in a photolithographic manner prior to etching the sacrificial layer in an electrochemical manner, and separating nanopillars of the nanopillar array in patterns of different regions.

5. The preparation method of a super-flexible transparent semiconductor film according to claim 1, wherein a buffer layer is also grown on the epitaxial substrate before the step of growing the sacrificial layer on the epitaxial substrate; the sacrificial layer and/or the buffer layer uses one or more layers of $Al_{1-b}Ga_bN$ materials, wherein $0\le b<1$, and b values corresponding to adjacent two layers of $Al_{1-n}Ga_nN$ materials are different.

6. The preparation method of a super-flexible transparent semiconductor film according to claim 5, wherein the b values corresponding to each layer of $Al_{1-b}Ga_bN$ materials on the epitaxial substrate gradually increases in an epitaxial growth direction.

7. The preparation method of a super-flexible transparent semiconductor film according to claim 1, wherein the nanopillar array includes a first $Al_{1-m}Ga_mN$ nanopillar, a second $Al_{1-x}Ga_xN$ nanopillar or an $In_{1-x}Ga_xN$ nanopillar, and a third $Al_{1-z}Ga_zN$ nanopillar that are stacked and grown sequentially on the $Al_{1-n}Ga_nN$ epitaxial layer from bottom to top, wherein $0<m\le1$, $0\le x\le1$, and $0<z\le1$.

8. The preparation method of a super-flexible transparent semiconductor film according to claim 7, wherein a height of the first $Al_{1-m}Ga_mN$ nanopillar is 100 nm to 1500 nm, a height of the second $Al_{1-x}Ga_xN$ nanopillar or the $In_{1-x}Ga_xN$ nanopillar is 20 nm to 500 nm, a height of the third $Al_{1-z}Ga_zN$ nanopillar is 20 nm to 600 nm; and/or a diameter of a single nanopillar in the nanopillar array is no more than 400 nm.

9. The preparation method of a super-flexible transparent semiconductor film according to claim 7, wherein the first $Al_{1-m}Ga_mN$ nanopillar includes a plurality of layers, m values corresponding to adjacent two layers of the first $Al_{1-m}Ga_mN$ nanopillar are different; and/or, the second $Al_{1-x}Ga_xN$ nanopillar or the $In_{1-x}Ga_xN$ nanopillar includes a plurality of layers, and x values corresponding to the adjacent two layers of the second $Al_{1-x}Ga_xN$ nanopillar or the adjacent two layers of the $In_{1-x}Ga_xN$ nanopillar are different; and/or, the third $Al_{1-z}Ga_zN$ nanopillar includes a plurality of layers, and z values corresponding to the adjacent two layers of the third $Al_{1-z}Ga_zN$ nanopillar are different.

10. The preparation method of a super-flexible transparent semiconductor film according to claim 9, wherein the m values gradually decrease in a growth direction of the first $Al_{1-m}Ga_mN$ nanopillar.

11. A super-flexible transparent semiconductor film produced using a preparation method of the super-flexible transparent semiconductor film, the preparation method of the super-flexible transparent semiconductor film including: providing an epitaxial substrate; growing a sacrificial layer on the epitaxial substrate; stacking and growing at least one layer of $Al_{1-n}Ga_nN$ epitaxial layer on the sacrificial layer, wherein $0<n\le1$; growing a nanopillar array containing GaN materials on the $A_{1-n}Ga_nN$ epitaxial layer; etching the sacrificial layer so as to peel off an epitaxial structure on the sacrificial layer as a whole; and transferring the epitaxial structure after peeling onto a surface of a flexible transparent substrate; wherein the super-flexible transparent semiconductor film includes a flexible transparent substrate and an epitaxial structure provided on a surface of the flexible transparent substrate, wherein the epitaxial structure includes at least one layer of $A_{1-n}Ga_nN$ epitaxial layer provided on the surface of the flexible transparent substrate, and a nanopillar array containing GaN materials and provided on the $Al_{1-n}Ga_nN$ epitaxial layer, wherein $0<n\le1$, and wherein the nanopillar array includes a first $Al_{1-n}Ga_nN$ nanopillar, a second $Al_{1-n}Ga_nN$ nanopillar or an $In_{1-n}Ga_nN$ nanopillar, and a third $Al_{1-z}Ga_zN$ nanopillar that are stacked and grown sequentially on the $Al_{1-n}Ga_nN$ epitaxial layer from bottom to top, wherein $0<m\le1$, $0\le x\le1$, and $0<z\le1$, and further wherein the first $Al_{1-m}Ga_mN$ nanopillar includes a plurality of layers, m values corresponding to adjacent two layers of the first $Al_{1-m}Ga_mN$ nanopillar are different; and/or, the second $Al_{1-x}Ga_xN$ nanopillar or the $In_{1-x}Ga_xN$ nanopillar includes a plurality of layers, and x values corresponding to the adjacent two layers of the second $Al_{1-x}Ga_xN$ nanopillar or the adjacent two layers of the $In_{1-x}Ga_xN$ nanopillar are different; and/or the third $Al_{1-z}Ga_zN$ nanopillar includes a plurality of layers, and z values corresponding to the adjacent two layers of the third $Al_{1-z}Ga_zN$ nanopillar are different.

12. The super-flexible transparent semiconductor film according to claim 11, wherein a total thickness Hi of all $Al_{1-n}Ga_nN$ epitaxial layers provided on the surface of the flexible transparent substrate satisfies: $1\text{ nm}\le H_1<800\text{ nm}$.

13. The super-flexible transparent semiconductor film according to claim 11, wherein a plurality of $Al_{1-n}Ga_nN$ epitaxial layers are stacked and grown on the sacrificial layer, n values corresponding to adjacent two layers of $Al_{1-n}Ga_nN$ epitaxial layers are different, and the nanopillar array is formed on an outermost $Al_{1-n}Ga_nN$ epitaxial layer.

14. The super-flexible transparent semiconductor film according to claim 13, wherein the n values corresponding to the plurality of $Al_{1-n}Ga_nN$ epitaxial layers on the sacrificial layer gradually decreases or gradually increases in an epitaxial growth direction.

15. The super-flexible transparent semiconductor film according to claim 11, wherein etching the sacrificial layer includes the steps of:

preparing electrodes conducting the sacrificial layer on the $Al_{1-n}Ga_nN$ epitaxial layer, and then etching the sacrificial layer in an electrochemical manner; and etching a pattern on the $Al_{1-n}Ga_nN$ epitaxial layer in a photolithographic manner prior to etching the sacrificial layer in an electrochemical manner, and separating nanopillars of the nanopillar array in patterns of different regions.

16. The super-flexible transparent semiconductor film according to claim 11, wherein a buffer layer is also grown on the epitaxial substrate before the step of growing the sacrificial layer on the epitaxial substrate; the sacrificial layer and/or the buffer layer uses one or more layers of $Al_{1-b}Ga_bN$ materials, wherein $0 \leq b < 1$, and b values corresponding to adjacent two layers of $Al_{1-n}Ga_nN$ materials are different; the b values corresponding to each layer of $Al_{1-b}Ga_bN$ materials on the epitaxial substrate gradually increases in an epitaxial growth direction.

17. The super-flexible transparent semiconductor film according to claim 11, wherein a height of the first $Al_{1-m}Ga_mN$ nanopillar is 100 nm to 1500 nm, a height of the second $Al_{1-x}Ga_xN$ nanopillar or the $In_{1-x}Ga_xN$ nanopillar is 20 nm to 500 nm, a height of the third $Al_{1-z}Ga_zN$ nanopillar is 20 nm to 600 nm; and/or a diameter of a single nanopillar in the nanopillar array is no more than 400 nm.

18. The super-flexible transparent semiconductor film according to claim 11, wherein the m values gradually decrease in a growth direction of the first $Al_{1-m}Ga_mN$ nanopillar.

\* \* \* \* \*

UNITED STATES PATENT AND TRADEMARK OFFICE
CERTIFICATE OF CORRECTION

| | |
|---|---|
| PATENT NO. | : 11,854,802 B2 |
| APPLICATION NO. | : 17/299954 |
| DATED | : December 26, 2023 |
| INVENTOR(S) | : Yukun Zhao et al. |

It is certified that error appears in the above-identified patent and that said Letters Patent is hereby corrected as shown below:

In the Claims

Column 12, Lines 31-32, Claim 11 delete "a first $Al_{1-n}Ga_nN$ nanopillar, a second $Al_{1-n}Ga_nN$ nanopillar or an $In_{1-n}Ga_nN$ nanopillar" and insert --a first $Al_{1-m}Ga_mN$ nanopillar, a second $Al_{1-x}Ga_xN$ nanopillar or an $In_{1-x}Ga_xN$ nanopillar--

Column 12, Line 48, Claim 12 delete "thickness Hi of all" and insert --thickness $H_1$ of all--

Signed and Sealed this
Twenty-first Day of May, 2024

*Katherine Kelly Vidal*

Katherine Kelly Vidal
*Director of the United States Patent and Trademark Office*